United States Patent
Tanaka

(10) Patent No.: US 6,867,534 B2
(45) Date of Patent: Mar. 15, 2005

(54) LOW-MASS AND COMPACT STAGE DEVICES EXHIBITING SIX DEGREES OF FREEDOM OF FINE MOTION, AND MICROLITHOGRAPHY SYSTEMS COMPRISING SAME

(75) Inventor: Keiichi Tanaka, Chiyoda-ku Tokyo (JP)

(73) Assignee: Nikon Corporation, Tokyo (JP)

( * ) Notice: Subject to any disclaimer, the term of this patent is extended or adjusted under 35 U.S.C. 154(b) by 87 days.

(21) Appl. No.: 10/159,411

(22) Filed: May 29, 2002

(65) Prior Publication Data

US 2002/0180312 A1 Dec. 5, 2002

(30) Foreign Application Priority Data

May 30, 2001 (JP) ........................................ 2001-162611

(51) Int. Cl.[7] .............................................. H01H 41/08
(52) U.S. Cl. ........................................ 310/328; 310/12
(58) Field of Search .......................... 310/328, 12, 312; 355/72–73; 356/401; H01L 41/08; G03B 27/58

(56) References Cited

U.S. PATENT DOCUMENTS

| | | |
|---|---|---|
| 5,760,564 A | 6/1998 | Novak |
| 6,008,610 A * | 12/1999 | Yuan et al. .................. 318/592 |
| 6,437,463 B1 * | 8/2002 | Hazelton et al. .............. 310/12 |
| 6,741,332 B2 * | 5/2004 | Nishi .......................... 310/12 |
| 6,788,393 B2 * | 9/2004 | Inoue .......................... 355/72 |

OTHER PUBLICATIONS

U.S. Appl. No. 09/899,946, filed Jul. 6, 2001, Okubo et al.
U.S. Appl. No. 09/971,506, filed Oct. 4, 2001, Tanaka.
U.S. Appl. No. 10/003,357, filed Nov. 14, 2001, Miura et al.

* cited by examiner

Primary Examiner—Thomas M. Dougherty
Assistant Examiner—Karen Addison
(74) Attorney, Agent, or Firm—Klarquist Sparkman, LLP

(57) ABSTRACT

Low-mass and compact stage devices are disclosed that exhibit, compared to conventional stage devices, reduced magnetic field fluctuations. An embodiment of such a stage device includes an X-Y coarse-movement stage portion that is drivable in the X-Y directions using respective air cylinders. A fine-movement stage portion is mounted on the X-Y coarse-movement stage portion. The fine-movement stage portion is drivable in any of the six degrees of freedom of motion (i.e., X, Y, Z, $\theta_X$, $\theta_Y$, and $\theta_Z$ motions) relative to the coarse-movement stage portion. Such fine movements are achieved using six piezo actuators. In a stage device configured for use in a microlithography apparatus, a wafer table or reticle table can be mounted on the fine-movement table.

46 Claims, 9 Drawing Sheets

LOW-MASS AND COMPACT STAGE DEVICES EXHIBITING SIX DEGREES OF FREEDOM OF FINE MOTION, AND MICROLITHOGRAPHY SYSTEMS COMPRISING SAME

FIELD

This disclosure pertains generally to microlithography (transfer-exposure of a pattern, defined on a reticle or mask (generally termed a "reticle" herein), to a "sensitive" substrate. Microlithography is a key technology used in the manufacture of microelectronic devices such as integrated circuits, displays, micromachines, and the like. More specifically, the disclosure pertains to stage devices as used in microlithography systems for accurate movement and positioning of the reticle and/or substrate (e.g., semiconductor wafer) during and in preparation for exposure. Even more specifically, the disclosure pertains to stage devices that are compact, lightweight, and produce no significant electric-field disturbance, and to microlithography systems comprising such stage devices.

BACKGROUND

Currently, so-called "H-type" and "I-type" X-Y stage devices represent the principal configurations of stage devices as used in optical microlithography systems. In each of these types of stage devices, a "moving guide" extends between two "fixed" guides that extend parallel to each other in a first drive direction (e.g., X-direction). Each end of the moving guide is attached to respective slider that moves, in coordination with the other slider, along the respective fixed guide in the first drive direction. A "self-advancing stage" is mounted to a slider that moves along the moving guide in a second drive direction (e.g., Y-direction). The respective names of these stage devices are derived from the overall H- or I-shaped configurations, respectively, of the fixed and moving guides. Typically, the H-type stage device is used whenever stage movements in both the X-direction and Y-direction are "long-stroke" motions, and the I-type stage device is used whenever stage movements are "long stroke" in only one of the X- and Y-directions and "short stroke" in the other direction.

Recently, linear motors have made their debut as stage-movers in H-type and I-type stage devices. At least one respective linear motor is provided for each of the X-axis and Y-axis movements of the stage. Use of linear motors has allowed the stage devices to have relatively simple, compact, and low-mass construction, with efficient operation.

If H-type and I-type stage devices as summarized above were to be used in certain conventional charged-particle-beam (CPB) microlithography apparatus as reticle stages and/or substrate (wafer) stages, certain problems would arise, as follows. In such stage devices both the "actuator" (moving portion) and "stator" (stationary portion) of the linear motor of the self-advancing stage move relative to the stators of the linear motors associated with the fixed guides. Unfortunately, despite the advantages (summarized in the preceding paragraph) of stage devices having such configurations, the stage devices exhibit magnetic-field fluctuations that degrade exposure accuracy. Magnetically shielding the linear motors is a conceivable countermeasure for these field fluctuations, but such a countermeasure tends to be excessively complex.

An alternative configuration of a stage device is a so-called "cross-shaped" stage device, in which two respective parallel fixed guides are provided in the X-direction and in the Y-direction. Between the fixed guides are respective moving guides that intersect with each other in a cross configuration. The moving guides are mutually slidable relative to the fixed guides, and a stage is mounted to the intersection of the moving guides. In this configuration (as in the H- and I-type configurations summarized above) each linear motor comprises an array of permanent magnets (typically constituting the "stator") and an "armature" coil (typically constituting the "actuator"). If the permanent magnets (which generate magnetic fields exhibiting relatively large fluctuations during operation) are secured to a stationary base and used as stators for both X-direction and Y-direction motion, and the armature coils (which generate magnetic fields exhibiting relatively small fluctuations during operation) are used as actuators, then magnetic-field fluctuations during exposure can be reduced somewhat compared to a converse configuration of stators and actuators. However, in the center of the cross-shaped stage configuration, the H-type or I-type stage configuration nevertheless is present, resulting in a very large stage device overall, which is impractical.

Another alternative stage configuration utilizes a linear motor exhibiting two degrees of freedom of motion. In such a linear motor the actuator can move in two directions (typically the X-direction and Y-direction) relative to stators arranged widely in a plane. However, this type of linear motor has a special configuration and is expensive.

Disclosed in U.S. Pat. No. 5,760,564 is a stage device that uses air bearings and vacuum pads to provide pressurization (pre-load) sufficient to impart a limited range of motion of a movable table in the Z-direction. The vacuum pads and air bearings are mounted to a base. With this device, the mass of the movable table is borne on the base. Also, the pressurization mechanism is simple, which allows the device to have relatively low mass overall. However, in a vacuum, no pre-load is applied If it is desired to increase the rigidity of the stage, many air bearings must be used, resulting in excessive complexity of the stage device. Although it is conceivable for pressurization to be provided by magnetic-attraction force instead of a vacuum, such an approach is not suitable for use in a CPB microlithography apparatus in which magnetic-field fluctuations should be maximally suppressed.

SUMMARY

In view of the shortcomings of conventional stage devices as summarized above, the present invention provides, inter alia, stage devices that exhibit, relative to conventional stage devices, lower magnetic-field fluctuations while retaining compactness and low overall mass.

According to a first aspect of the invention, stage devices are provided for holding and moving an object in a space defined by an X-direction, a Y-direction, and a Z-direction that are mutually perpendicular to each other. An embodiment of such a stage device comprises an X-Y coarse-movement stage portion comprising a moving member and respective coarse-movement actuators situated and configured to move the moving member in an X-Y plane defined by the X-direction and the Y-direction. The stage device also comprises a fine-movement stage portion including a fine-movement table and a fine-movement actuator system coupled to the fine-movement table. The fine-movement table is mounted on the moving member of the X-Y coarse-movement stage portion. The fine-movement actuator system is configured to move the fine-movement table relative to the X-Y coarse-movement stage portion in any of six degrees of freedom of motion including motion in the X-direction, the Y-direction, the Z-direction, an angle $\theta_X$ about an X-direction axis, an angle $\theta_Y$ about a Y-direction axis, and an angle $\theta_Z$ about a Z-direction axis. By using the X-Y coarse-movement stage portion for performing relatively "coarse" positioning control and using the fine-movement stage portion for performing relatively "fine" positioning of the stage, more accurate and higher-velocity positioning of an object (e.g., reticle or substrate) held on the stage is possible.

The coarse-movement actuators can be of any of various types. For example, the coarse-movement actuators can be respective air cylinders, respective ultrasonic actuators, or linear motors, wherein air cylinders and ultrasonic actuators are especially desirable for use of the stage device in CPB microlithography systems because these actuators do not generate any significant magnetic fields or magnetic-field fluctuations.

The fine-movement actuator system can comprise multiple piezo-electric actuators. For example, the fine-movement table can be supported relative to the moving member of the X-Y coarse-movement stage portion by such piezo-electric actuators. In this configuration, the fine-movement table desirably has three corners each supported by a respective pair of piezo-electric actuators extending from the respective corner to the moving member of the coarse-movement stage portion. One of the respective piezo-electric actuators on each corner desirably is parallel to one of the respective piezo-electric actuators on another of the corners.

The fine-movement table can be supported relative to the moving member of the X-Y coarse-movement stage portion by a fine-movement actuator system that comprises a parallel-linkage mechanism. A parallel-linkage mechanism allows the fine-movement table to be driven with great stability at high velocity. In a particularly advantageous configuration, the parallel-linkage mechanism comprises at least three pairs of fine-movement actuators extending from respective locations on the fine-movement table to the moving member of the X-Y coarse-movement stage portion. One of the respective fine-movement actuators at each location desirably is parallel to one of the respective fine-movement actuators at another of the locations. Further desirably, the actuators are piezo-electric actuators.

In a particular embodiment of the stage device, the fine-movement table has first, second, and third corners (e.g., is triangular in profile), wherein the fine-movement table is supported at each corner relative to the moving member of the X-Y coarse-movement stage portion. Extending from each corner on the fine-movement table to the moving member of the coarse-movement stage portion are two respective fine-movement piezo-actuators. One of the respective fine-movement piezo-electric actuators at each corner is parallel to one of the respective fine-movement piezo-electric actuators at another of the corners.

In another embodiment, the X-Y coarse-movement stage portion comprises two fixed guides extending parallel to each other in a first direction within the X-Y plane. Each fixed guide has a respective first slider that is slidable relative to the fixed guide as guided by the respective fixed guide. A respective coarse-movement drive mechanism is associated with each of the first sliders and is configured to cause motion of the respective first slider relative to the respective fixed guide. A moving guide is attached to both first sliders and extends in a second direction from one first slider to the other. A second slider (to which the fine-movement table is mounted) is slidable relative to the moving guide as guided by the moving guide. A coarse-movement drive mechanism is associated with the second slider and is configured to cause motion of the second slider relative to the moving guide. The coarse-movement drive mechanisms associated with the first sliders can be respective linear motors, and the coarse-movement drive mechanism associated with the second slider desirably is a non-electromagnetic actuator. Thus, actuation of the coarse-movement drive mechanism associated with the second slider does not generate any magnetic-field fluctuations. Furthermore, any magnetic-field fluctuations generated by the coarse-movement drive mechanism associated with the first sliders are well-separated from an optical axis passing through the stage device.

If the X-Y coarse-movement stage portion is an H-type stage configuration, then the first sliders can slide along their respective fixed guides in a direction parallel to a scan axis of the stage apparatus, and the second slider can slide along its moving guide in a direction parallel to a step axis of the stage apparatus. If the X-Y coarse-movement stage portion is an I-type stage configuration, then the first sliders can slide along their respective fixed guides in a direction parallel to a step axis of the stage apparatus, and the second slider can slide along its moving guide in a direction parallel to a scan axis of the stage apparatus.

The stage devices summarized above can be used for holding any of various items, and are especially suitable for holding a reticle or substrate as used in a CPB microlithography apparatus.

According to another aspect of the invention, microlithography apparatus are provided. An embodiment of such an apparatus comprises a reticle stage, an illumination-optical system, a substrate stage, and a projection-optical system. The reticle stage is situated and configured to hold a pattern-defining reticle. The illumination-optical system is situated optically upstream of the reticle stage and is configured to direct an energy beam to a region of the reticle so as to illuminate the region. The substrate stage is situated optically downstream of the reticle stage and is configured to hold a sensitive substrate to which the reticle pattern is to be transferred. The projection-optical system is situated between the reticle stage and the substrate stage and is configured to projection-expose the energy beam, which has passed through or reflected from the illuminated region on the reticle, onto a corresponding region on the sensitive substrate. At least one of the reticle stage and substrate stage is a stage device such as any of the stage devices summarized above.

According to another aspect of the invention, CPB microlithography systems are provided that comprise at least one stage device such as any of the stage devices summarized above.

The foregoing and additional features and advantages of the invention will be more readily apparent from the following detailed description, which proceeds with reference to the accompanying drawings.

BRIEF DESCRIPTION OF THE DRAWINGS

FIG. 3(A) is a "front" elevational view, FIG. 3(B) is a plan view, FIG. 3(C) is a "rear" elevational view, and FIG. 3(D) is a "side" elevational view.

DETAILED DESCRIPTION

The invention is described below in the context of representative embodiments that are not intended to be limiting in any way. Also, the various embodiments are described in the context of an electron-beam microlithography system as a representative charged-particle-beam microlithography system. It will be understood that the principles described below are applicable with equal facility to microlithography systems utilizing an alternative type of charged particle beam, such as an ion beam, and to microlithography systems utilizing another type of energy beam, such as a VUV beam, X-ray beam, or EUV beam. The following also will be understood: (1) The stage devices described below can be used in general for positioning of an object in any of various environments, including a vacuum environment and/or in an environment in which suppression of fluctuating magnetic fields is important. (2) The reticle or mask (generally termed "reticle" herein) referred to herein can be a refractive or reflective reticle. (3) The optical systems referred to herein can be refractive or reflective, or a combination of refractive and reflective.

Representative Embodiment of Microlithography System

Figure 4:
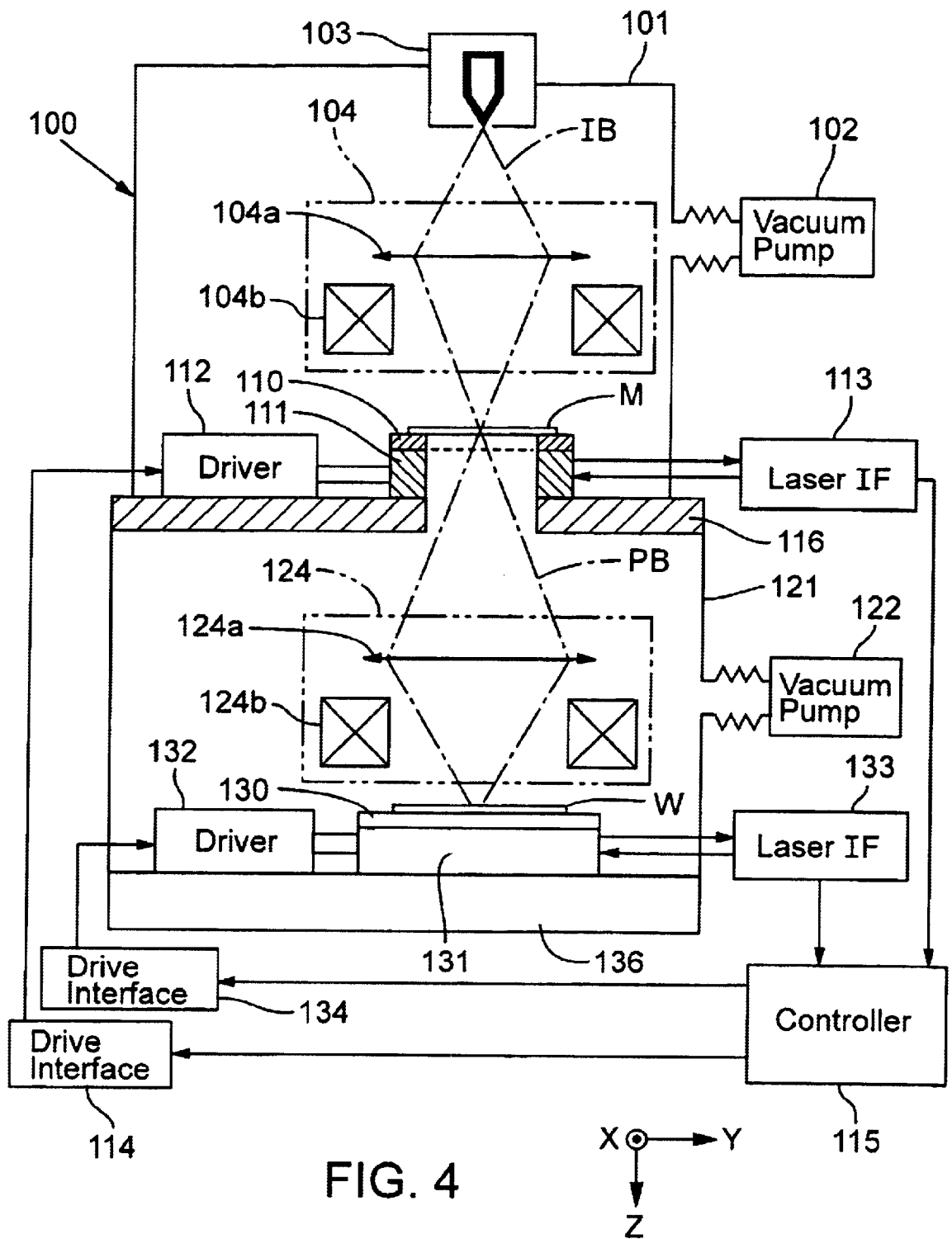
FIG. 4 is an elevational schematic diagram of a charged-particle-beam (specifically, electron-beam) microlithography apparatus including at least one stage device according to an embodiment.

Turning first to FIG. 4, a representative embodiment of an electron-beam microlithography system 100 is shown schematically. The system 100 comprises a stage device according to, for example, any of the stage-device embodiments described below. The system 100 also comprises a first ("upper") optical column 101 configured as a vacuum chamber in this embodiment. The atmosphere inside the upper optical column 101 is evacuated to a suitable vacuum level using a vacuum pump 102 connected to the upper optical column 101.

An electron gun 103 is situated at the extreme upstream (topmost in the figure) portion of the upper optical column 101, and emits an electron beam ("illumination beam" IB) in a downstream direction (downward in the figure). Downstream of the electron gun 103 are an illumination-optical system 104 and a reticle M. The illumination-optical system 104 comprises a condenser lens 104a, a deflector 104b, and other components as required to cause the illumination beam IB to irradiate a desired region on the reticle M.

The illumination beam IB emitted from the electron gun 103 is condensed by the condenser lens 104a for illuminating the reticle M. The deflector 104b deflects the illumination beam IB in one or more lateral directions on the reticle M within the optical field of the illumination-optical system. For example, a reticle M as used for CPB microlithography typically is divided into multiple exposure units (usually configured as "subfields") that are illuminated by the illumination beam IB in a sequential manner. The exposure units are arrayed in rectilinear columns and rows, wherein each row typically has a length substantially equal to the optical field of the illumination-optical system 104. In FIG. 4, the illumination-optical system 104 is depicted as having only a single optical unit (i.e., the condenser lens 104a). An actual illumination-optical system typically has multiple optical units, i.e., lenses and/or mirrors, beam-shaping apertures, deflectors, and the like.

The reticle M is secured by electrostatic attraction, vacuum suction, or other suitable means (depending upon the reticle environment) to a reticle chuck 110 mounted on an upstream-facing surface of a reticle stage 111. The reticle stage 111, in turn, is mounted on a base 116.

Figure 1:
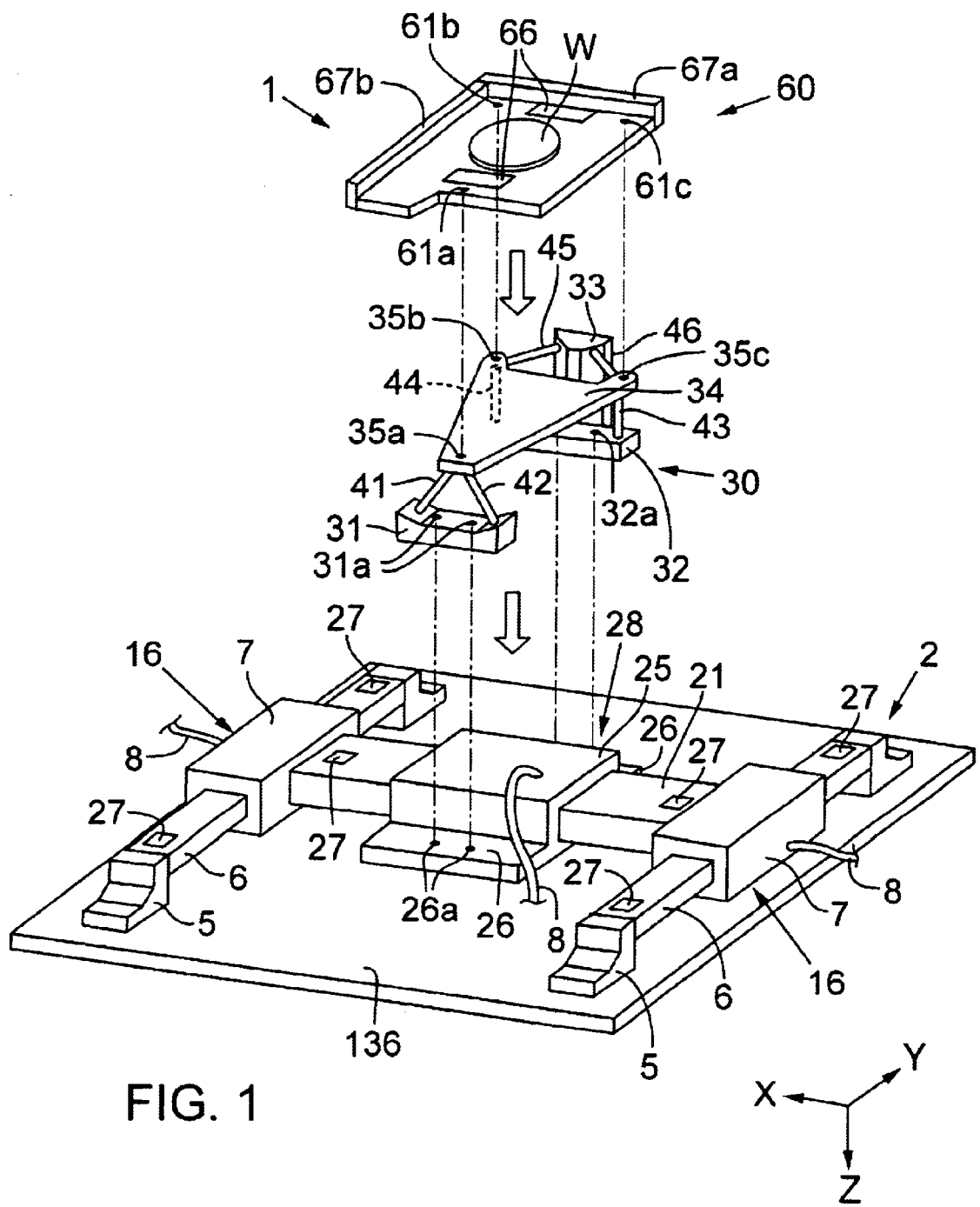
FIG. 1 is an exploded oblique view of a stage device according to a first representative embodiment.

The reticle stage 111 is actuated for movement in at least the X- and Y-directions by a reticle-stage driver 112 operably connected to the reticle stage 111. Although the reticle-stage driver 112 is depicted on the left side in the figure, it typically is incorporated into the actual mechanism of the reticle stage 111 as shown in FIG. 1 and described in detail later below. The reticle-stage driver 112 is connected to a controller 115 via a drive interface 114. In addition, a laser interferometer (IF) 113 is situated relative to the reticle stage 111 (on the right side of the reticle stage 111 in the figure). The laser interferometer 113 is connected to the controller 115 and serves to obtain accurate data concerning the position of the reticle stage 111 in the X- and Y-directions. The positional data obtained by the laser interferometer 113 is routed to the controller 115. To position the reticle stage 111 at a target position, a respective command is transmitted from the controller 115 to the drive interface 114. The drive interface 114, in response to the command, appropriately energizes the driver 112 to move the stage 111 to the corresponding position. The components 111–115 functioning in this manner achieve accurate, real-time feedback control of the position of the reticle stage 111.

A second ("lower") optical column 121 is situated downstream of the base 116. The lower optical column is configured as a vacuum chamber in this embodiment and also serves as a "wafer chamber." The atmosphere inside the lower optical column 121 is evacuated to a suitable vacuum level using a vacuum pump 122 connected to the lower optical column 121. Situated inside the lower optical column are a wafer W and a "projection-optical system" 124 including a condenser lens (projection lens) 124a and a deflector 124b.

The electron beam passing through the reticle M is condensed by the condenser lens 124a and deflected as required by the deflector 124b to form a resolved image at a prescribed location on the wafer W of the illuminated region on the reticle M. Although, in the figure, the projection-optical system 124 is depicted as having only one optical unit (i.e., the condenser lens 124a), the projection-optical system 124 actually includes multiple optical units. The optical units can comprise lenses or mirrors only (or lenses and mirrors), coils, deflectors, and the like as required for proper image formation and for aberration correction.

The wafer W is held by electrostatic attraction, vacuum suction, or other suitable means (depending upon the wafer environment) to a wafer chuck 130 mounted on an upstream-facing surface of a wafer stage 131. The wafer stage 131, in turn, is mounted on a base 136.

The wafer stage 131 is actuated for movement in at least the X- and Y-directions by a wafer-stage driver 132 operably connected to the wafer stage 131. Although the wafer-stage driver 132 is depicted on the left side in the figure, it typically is incorporated into the actual mechanism of the wafer stage 131 in a manner similar to that of the reticle stage 111. The wafer-stage driver 132 is connected to the controller 115 via a drive interface 134. In addition, a laser interferometer (IF) 133 is situated relative to the wafer stage 131 (on the right side of the wafer stage 131 in the figure). The laser interferometer 133 is connected to the controller 115 and serves to obtain accurate data concerning the position of the wafer stage 131 in the X- and Y-directions. The positional data obtained by the laser interferometer 133 is routed to the controller 115. To position the wafer stage 131 at a target position, a respective command is transmitted from the controller 115 to the drive interface 134. The drive interface 134, in response to the command, appropriately energizes the driver 132 to move the wafer stage 131 to the corresponding position. The components 131–134 and 115 functioning in this manner achieve accurate, real-time, feedback control of the position of the wafer stage 131.

First Representative Embodiment of Stage Device

A stage device 1 according to a first representative embodiment is depicted in FIG. 1, in which the subject stage device 1 is mounted on the base 136, as discussed above in connection with FIG. 4, (I.e., the stage device 1 in FIG. 1 is the wafer stage 131 in the system shown in FIG. 4.) The base 136 extends in the X-Y plane. The stage device 1 comprises an X-Y coarse-movement stage 2 mounted on an upstream-facing surface of the base 136. Mounted to the coarse-movement stage 2 is a fine-movement stage 30 capable of exhibiting six degrees of freedom of motion relative to the coarse-movement stage 2 (i.e., X, Y, Z, $\theta_X$, $\theta_Y$, and $\theta_Z$ motions. Mounted to the fine-adjustment stage 30 is a wafer table 60 configured for holding the wafer W.

Two fixed guides 6, extending parallel to each other in the Y-direction, are secured at respective locations on the upstream-facing surface of the base 136 by respective guide-mounting members 5. Each of these two fixed guides 6 and their peripheral members are configured in basically the same way. A respective hollow-box-shaped Y-slider 7 is engaged with each fixed guide 6 in a manner allowing the Y-sliders 7 to slide along their respective fixed guides 6 in the Y-direction. Such sliding is achieved with substantially zero friction by means of respective air bearings (including air pads 51; see FIG. 2). Each Y-slider in association with its respective fixed guide 6 defines a respective air cylinder 16 (discussed below with reference to FIG. 2). The air cylinders 16 actuate the respective Y-sliders 7 to move in the Y-direction relative to their respective fixed guides 6.

Connected to each of the Y-sliders is a respective air conduit 8 that supplies air from a compressed source to the air pads in the respective Y-slider 7. As discussed below in detail with reference to FIG. 2, the air thus supplied to the air pads of the Y-sliders 7 is exhausted from the respective air bearings via respective recovery and exhaust conduits provided within the respective fixed guides 6. Situated at each end of each fixed guide 6 is a respective air-control valve 27 that controls the pressure of air within respective air chambers of the air cylinder associated with the respective fixed guide 6 and Y-slider (see FIG. 2). In this embodiment, each air-control valve 27 is a servo valve driven by a respective VCM (voice-coil motor). Desirably, the air-control valves 27 are arranged in the vicinity of the respective air cylinders 16 to reduce delays of air-pressure propagation from the air-control valves to the air cylinders.

A moving guide 21 is attached to and extends in the X-direction between the Y-sliders 7. A hollow-box-shaped X-slider 25 is engaged with the moving guide 21 in a manner allowing the X-slider 25 to slide along the moving guide 21 in the X-direction. Such sliding is achieved with substantially zero friction by means of air bearings (including air pads 51; see FIG. 2). The X-slider in association with its moving guide 21 defines a respective air cylinder 28 (discussed below with reference to FIG. 2), which actuates the X-slider 25 to move in the X-direction relative to the moving guide 21. Note that the basic configuration of the air cylinder 28 is the same as the configuration of the air cylinder 16 shown in detail in FIG. 2.

Connected to the X-slider 25 is an air conduit 8 that supplies air from a compressed source to the air pads in the X-slider 25. As discussed below, with reference to FIG. 2, the air thus supplied to the air pads of the X-slider 25 is exhausted from the respective air bearings via respective recovery and exhaust conduits provided within the moving guide 21.

Figure 2:
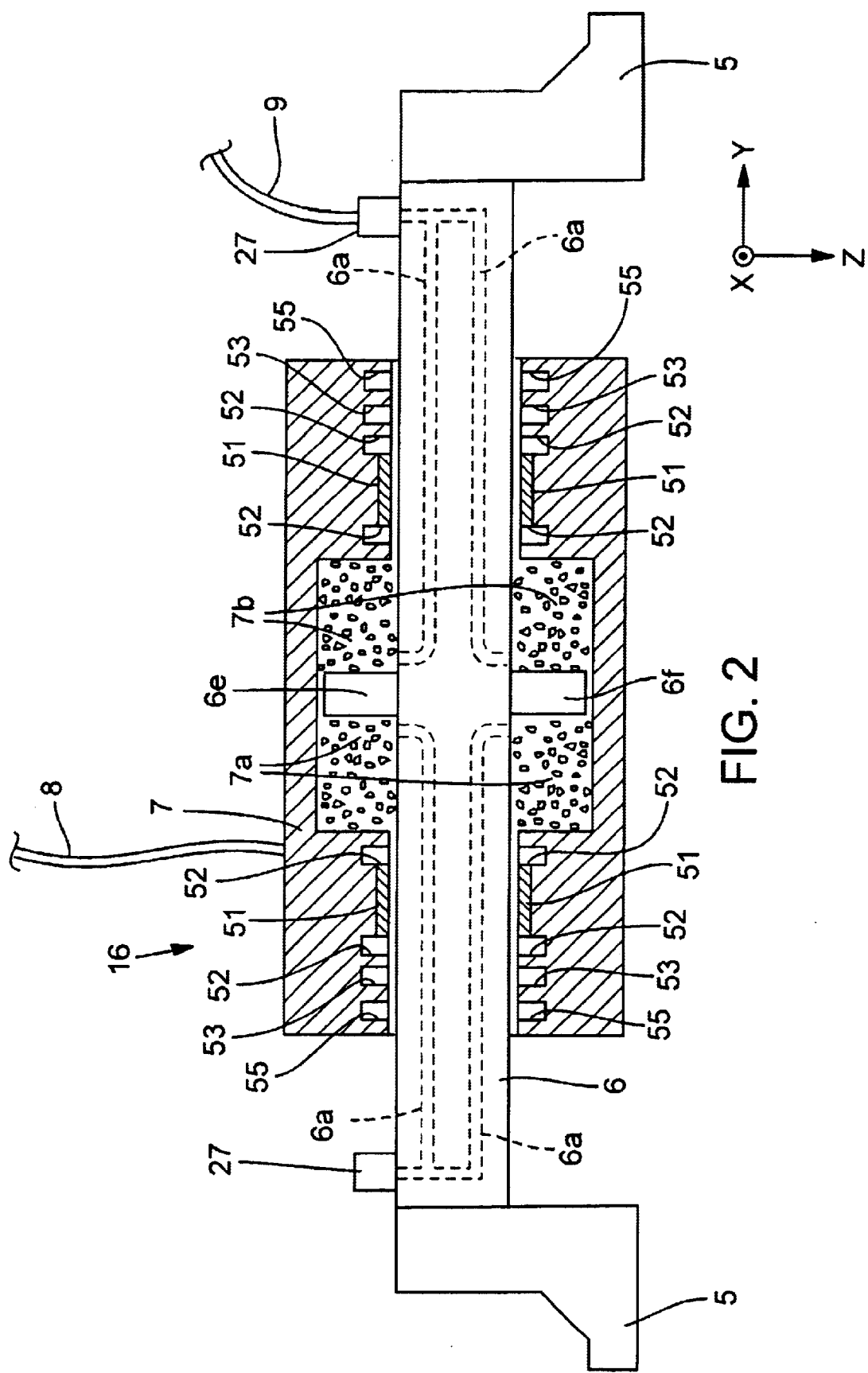
FIG. 2 is an elevational section of an air cylinder as used in the X-Y coarse-movement stage of the stage-device embodiment of FIG. 1.

Situated at each end of the moving guide 21 is a respective air-control valve 27 that controls the pressure of air within each air chamber of the air cylinder 28 associated with the moving guide 21 and X-slider (see FIG. 2). In this embodiment, the air-control valves 27 are servo valves driven by a VCM (voice-coil motor). Desirably, the air-control valves 27 are arranged in the vicinity of the respective air cylinders so as to reduce delays of air-pressure propagation from the air-control valves to the air cylinders.

Respective flanges 26 extend outward in the Y-direction from the longitudinal "lower" edges of the X-slider 25. Each flange 26 defines respective screw holes 26a substantially at the center of the flange 26, by which holes the fine-movement stage 30 is secured to the flanges 26. Specifically, the fine-movement stage 30 includes leg pads 31, 32 that bolt onto the respective flanges 26 by screws (not shown) threaded into the screw holes 26a from respective through-holes 31a, 32a in the leg pads 31, 32.

Associated with the first leg pad 31 are two piezo-actuators 41, 42 that collectively have a Λ-shaped profile. The piezo-actuators 41, 42 provide Z-direction support (and movement) of the fine-movement stage 30 relative to the first leg pad 31. Two parallel piezo-actuators 43, 44 provide Z-direction support (and movement) of the fine-movement stage 30 relative to the second leg pad 32. Also attached to and extending in the Z-direction from the second leg pad 32 is an actuator support 33. From an "upper" end of the actuator support 33 extend two piezo-actuators 45, 46 that collectively extend in a ">" manner in the X-Y plane to a plate (fine-movement table) 34 that desirably is triangular in profile. The distal ends of the piezo-actuators 45, 46 are connected to respective corners (vertices) of the fine-movement table 34. The fine-movement table 34 also is connected to the distal ends of the piezo-actuators 41, 42, 43, 44. The fine-movement table 34 defines three voids 34a, 34b, 34c (see FIG. 3) that reduce the mass of the fine-movement table 34. The fine-movement table 34 also defines respective screw holes 35a, 35b, 35c at each vertex of the fine-movement table 34 that are used for mounting the wafer table 60 to the fine-movement table 34 (using screws, not shown, extending through respective holes 61a, 61b, 61c defined in the wafer table 60).

An electrostatic wafer chuck 130 (see FIG. 4), attached centrally on the upstream-facing surface of the wafer table 60, secures the wafer W to the wafer table 60 Also situated on the upstream-facing surface of the wafer table 60, flanking the wafer chuck 130, are mark plates 66. The mark plates 66 define respective marks used for determining the position of the wafer table 60 in the X- and Y-directions. The mark plates 66 are mounted at two locations at the side of the wafer W on the wafer table 60. Respective moving mirrors 67a, 67b are mounted along two orthogonal edges of the wafer table 60. The respective outwardly facing side surfaces of the moving mirrors 67a, 67b are polished to high-accuracy planarity and they are used as the reflective surfaces for the laser interferometer 133 (FIG. 4).

A typical air cylinder (represented by the air cylinder 16) is configured as shown in FIG. 2. FIG. 2 also depicts relevant portions of the fixed guide 6 and Y-slider 7 of the stage device shown in FIG. 1. As shown, the hollow-box-shaped Y-slider 7 is engaged with the fixed guide 6. The fixed guide 6 and Y-slider 7 collectively define the air cylinder 16, by which the Y-slider is urged to move in the Y-direction relative to the fixed guide 6.

The respective interior surfaces of both ends of the Y-slider 7 serve as respective "sliding" surfaces with respect to the fixed guide 6, although the interior surfaces do not actually contact the surface of the fixed guide 6. This avoidance of contact is achieved by respective air bearings each comprising a respective air pad 51 situated in a respective recess defined in the interior surface. In FIG. 2 respective air pads 51 are attached to the "top" and "bottom" sliding surfaces in the vicinity of both ends of the Y-slider 7. Although not visible in the view shown in FIG. 2, respective air pads 51 also are attached to both "side" surfaces in the vicinity of both ends of the Y-slider. Air is supplied to the air pads 51 from the conduit 8. Associated with each air bearing are respective "guard rings" including two atmospheric-venting guard rings 52, a low-vacuum-exhaust guard ring 53, and a high-vacuum-exhaust guard ring 55. At each air bearing, the respective guard rings encircle the fixed guide 6 parallel to each other. Thus, the respective guard rings serve all the air pads 51 of the respective air bearing. Note that the air pads 51 of each air bearing are flanked by the two atmospheric-venting guard rings 52. Respective conduits (not shown) defined in the Y-slider 7 conduct air from the guard rings 52, 53, 55.

Referring further to FIG. 2, the fixed guide 6 defines partition plates 6e, 6f (the partition plates 6e, 6f actually are respective parts of a flange extending around the fixed guide 6). The partition plates 6e, 6f are situated substantially at the center of the fixed guide 6. Thus, with the Y-slider 7 in position relative to the fixed guide 6 as shown, a central cavity of the Y-slider 7 is divided by the partition plates 6e, 6f into opposing air chambers 7a, 7b. Conduits 6a extending through the fixed guide 6 supply air selectively to the air chambers 7a, 7b. Flow of air through the conduits 6a, and thus into the air chambers 7a, 7b is controlled by selective actuation of the air-control valves 27 that connect respective conduits 9 to the respective conduits 6a. Thus, the air-control valves 27 control the air-pressure differential in the air chambers 7a, 7b and hence movement of the Y-slider 7 in the Y-direction relative to the fixed guide 6. E.g., a higher pressure in the air chamber 7a than in the air chamber 7b causes leftward movement (in the figure) of the Y-slider 7 on the fixed guide 6.

Figure 3A:
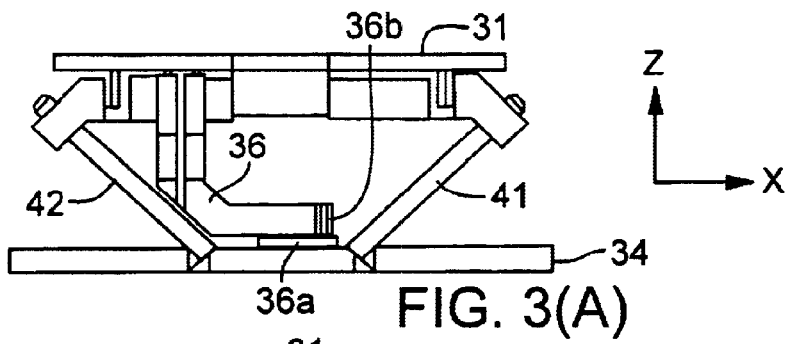
FIGS. 3(A)–3(D) are orthogonal views of the fine-movement table as used in the first representative embodiment of a stage device.
Figure 3B:
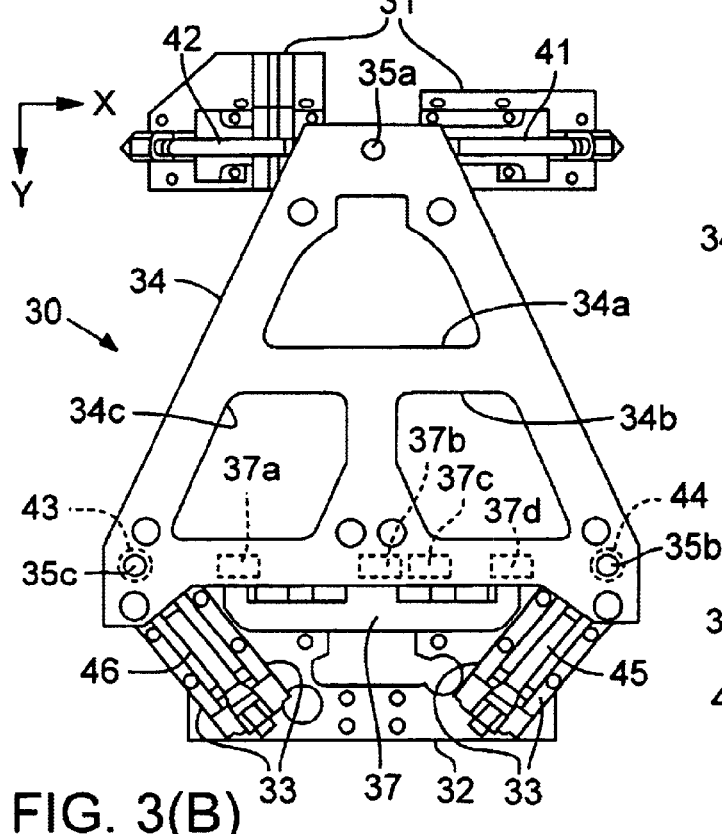

The fine-movement stage 30 is detailed in FIGS. 3(A)–3(D). Turning first to FIG. 3(B), the fine-movement stage 30 comprises the fine-movement table 34 that, in this embodiment, has a nearly isosceles-triangle profile. Connected to each vertex of the fine-movement table 34 are first ends of a respective pair of piezo-actuators 41 and 42, 43 and 46, and 44 and 45 that provide support for the respective vertex. The second ends of the piezo-actuators 41, 42 are connected to the leg pad 31, and the second ends of the piezo-actuators 43 and 44 are connected to the leg pad 32 (see below). Thus, each vertex of the fine-movement table 34 is supported in the Z-direction relative to the base 136 (FIG. 1).

Turning now to FIG. 3(A), details are shown of the vertex to which the piezo-actuators 41, 42 are connected. The piezo-actuators 41, 42 extend diagonally from the leg pad 31 to the vertex collectively in a "Λ" manner in the Z-X plane. The respective first ends of the piezo-actuators 41, 42 are rotatably connected by respective pins (not shown) to the vertex of the fine-movement table 34. The respective second ends of the piezo-actuators 41, 42 are rotatably connected by respective pins (not shown) to the leg pad 31.

An L-shaped sensor arm 36 extends in the Z-X direction from the leg pad 31 toward the fine-movement table 34. Provided on the distal end of the sensor arm 36 is a first capacitance-type position-sensor 36a. The first position-sensor 36a is separated from a respective sensor pad (not shown, but situated on the "underside" of the fine-movement table 34) by a slight gap. Also provided on the distal end of the sensor arm 36 is a second capacitance-type position-sensor 36b that is oriented orthogonally relative to the first position-sensor 36a. The second position-sensor 36b is separated from a respective sensor pad (not shown, but extending from the "under" surface of the fine-movement table 34) by a slight gap.

Figure 3D:
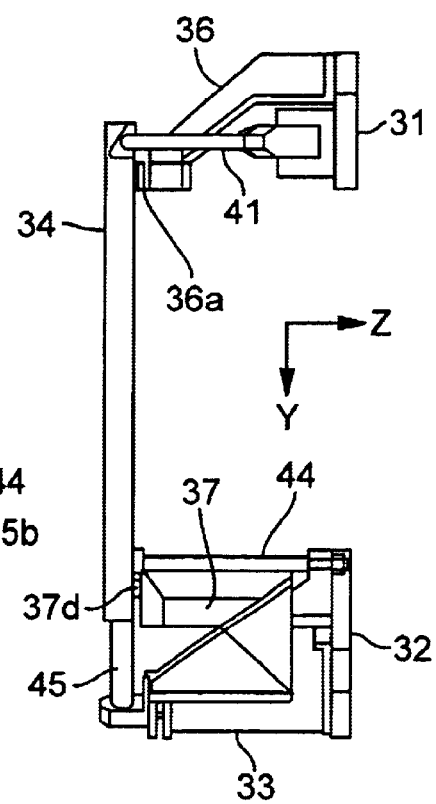
Figure 3C:
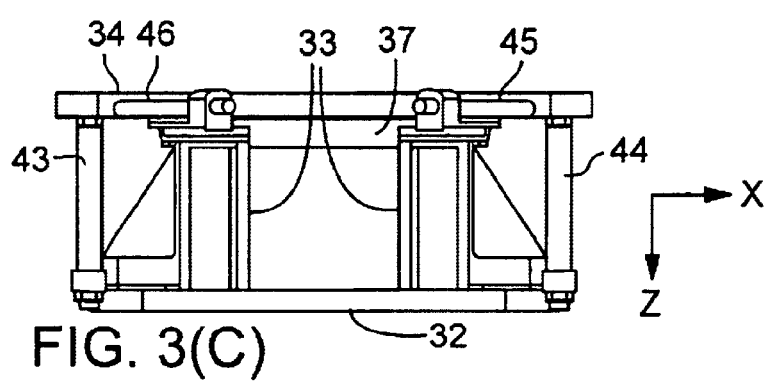

Turning now to FIG. 3(C), details are shown of the vertices to which the respective piezo-actuators 43, 46 and 44, 45 are connected. As noted above, the piezo-actuators 43, 44 extend parallel to each other in the Z-direction from respective vertices of the fine-movement table 34 to the leg pad 32. The respective first ends of the piezo-actuators 43, 44 are rotatably connected by respective pins (not shown) to the respective vertices of the fine-movement table 34. The respective second ends of the piezo-actuators 43, 44 are rotatably connected by respective pins (not shown) to respective ends of the leg pad 32. As understood from FIGS. 3(B) and 3(C), actuator supports 33 extend from the leg pad 32 in the Z-direction toward respective vertices of the fine-movement table 34. Piezo-actuators 45, 46 extend (in the X-Y plane, collectively in a "Λ"-shaped manner) from respective vertices of the fine-movement table 34 to respective actuator supports 33. The respective first ends of the piezo-actuators 45, 46 are rotatably connected by respective pins (not shown) to the respective vertex of the fine-movement table 34. The respective second ends of the piezo-actuators 45, 46 are rotatably connected by respective pins (not shown) to the respective actuator support 33.

As shown in detail in FIGS. 3(B) and 3(D), a sensor arm 37 extends in the Z-direction from the leg pad 32 toward the fine-movement table 34. Provided on the distal end of the sensor arm 37 are first, second, third, and fourth capacitance-type position-sensors 37a, 37b, 37c, 37d, respectively. Each position-sensor 37a–37d is separated from a respective sensor pad (not shown, but attached to the "under" surface of the fine-movement table 34) by a slight gap.

The position-sensors 36a, 37a, and 37d are used for measuring the position of the fine-movement table 34 in the Z-direction, the $\theta_X$-direction, and the $\theta_Y$-direction, respectively. The position-sensors 36b and 37c are used for measuring the position of the fine-movement table 34 in the X-direction and $\theta_Z$-direction, respectively. The position-sensor 37b is used for measuring the position of the fine-movement table 34 in the Y-direction. Thus, position sensing is achieved for all six degrees of freedom of motion of the fine-movement stage 30.

Individual electrical actuation of the piezo-actuators 41–46 causes the respective piezo-actuator(s) 41–46 to lengthen or shorten. For example, by lengthening or shortening each of the piezo-actuators 41–44 by the same amount, the fine-movement table 34 is moved in the Z-direction relative to the base 136. The fine-movement table 34 is moved in the Y-direction by keeping all the piezo-actuators 41, 42, 43, 44 substantially fixed in length while lengthening or shortening the piezo-actuators 45 and 46. The fine-movement table 34 is moved in the X-direction by keeping the piezo-actuators 43, 44 substantially fixed in length while lengthening or shortening the piezo-actuators 41, 42, 45, and 46.

Desirably, to achieve a desired independent motion of the fine-movement table 34, each of the six piezo-actuators 41-46 is actuated independently as required. For example, the fine-movement table 34 can be driven in the $\theta_X$-direction by keeping all the piezo-actuators 43, 44, 45, 46 substantially fixed in length while lengthening or shortening the piezo-actuators 41 and 42. The fine-movement table 34 can be driven in a positive $\theta_Y$-direction by shortening the piezo-actuators 41, 44 and lengthening the piezo-actuators 42, 43. The fine-movement table 34 can be driven in the $\theta_Z$-direction by keeping the piezo-actuators 43, 44 substantially fixed in length while lengthening or shortening the piezo-actuators 41, 42, 45, 46 as required.

Thus, as described above, the fine-movement table 34 can be moved with six degrees of freedom (X, Y, Z, $\theta_X$, $\theta_Y$, and $\theta_Z$) by selectively lengthening and shortening the piezo-actuators 41–46 in an independent manner as required. Also, in the stage device 1 of this embodiment, by moving the coarse-movement stage 2 in the X-and Y-directions using the air cylinders 16, 28, the fine-movement stage 30 (mounted to the coarse-movement table 2) is positionable in the X- and Y-directions without generating any significant magnetic-field fluctuation. In addition, the wafer W can be positioned accurately by driving the fine-movement stage 30, mounted to the coarse-movement stage 2, in any of the six degrees of freedom collectively provided by the piezo-actuators 41–46 (constituting an exemplary fine-movement actuator system). Also, in the stage device 1 of this embodiment, by providing position sensors adjacent the fine-movement table 34, the response time is reduced substantially, allowing any non-linear characteristics of the piezo-actuators to be corrected in real time.

Second Representative Embodiment of Stage Device

Figure 5:
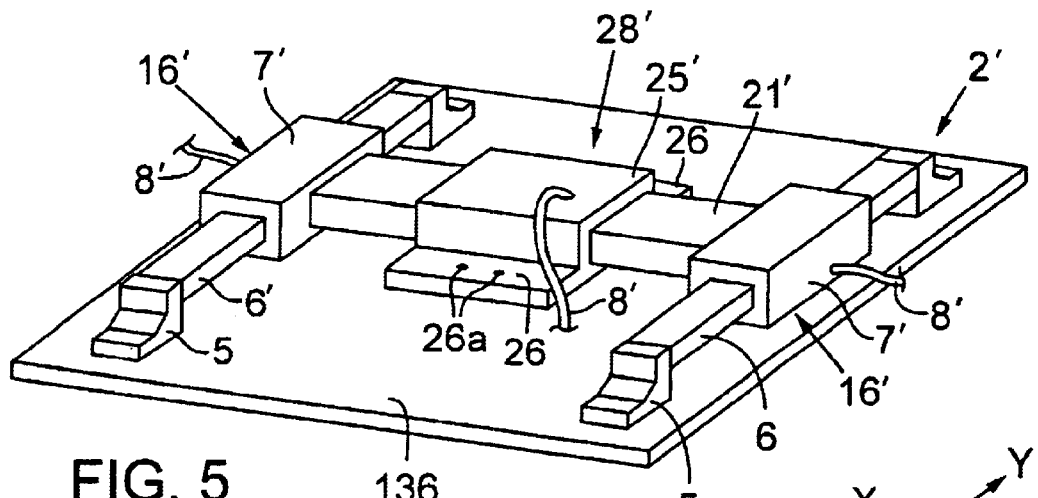
FIG. 5 is a perspective view of the X-Y coarse-movement stage portion of a stage device according to the second representative embodiment.

Certain components of a stage device according to this embodiment are depicted in FIG. 5, in which components similar to corresponding components of the first representative embodiment have the same respective reference numerals. In this embodiment, the X-Y coarse-movement stage 2' is configured such that all the actuators imparting X-direction and Y-direction motion are ultrasonic actuators. The X-Y coarse-movement stage 2' is mounted on a base 136 extending in the X- and Y-directions. As shown in FIG. 1, a fine-movement stage 30 (having six degrees of freedom of motion) and a wafer table 60 are mounted on the X-Y coarse-movement stage 2'.

Two fixed guides 6', each extending parallel to each other in the Y-direction, are secured at respective locations on the upstream-facing surface of the base 136 by respective guide-mounting members 5. Each of these two fixed guides 6' and their peripheral members are configured in basically the same way. A respective hollow-box-shaped Y-slider 7' is engaged with each fixed guide 6' in a manner allowing the Y-sliders 7' to slide along their respective fixed guides 6' in the Y-direction. Such sliding is achieved with substantially zero friction by means of respective air bearings, as in the first representative embodiment.

Each fixed guide 6' and its respective Y-slider 7' comprises a respective ultrasonic actuator 16' by which the Y-sliders 7' are driven in the Y-direction. Wiring 8' for supplying electrical power to each ultrasonic actuator 16' enters the side of the respective Y-slider 7'.

A moving guide 21' is attached to and extends in the X-direction between the Y-sliders 7'. A hollow-box-shaped X-slider 25' is engaged with the moving guide 21' in a manner allowing the X-slider 25' to slide along the moving guide 21' in the X-direction. Such sliding is achieved is achieved with substantially zero friction by means of air bearings, as in the first representative embodiment. The moving guide 21' and X-slider 25' comprise an ultrasonic actuator 28' by which the X-slider 25' is driven in the X-direction. The basic configuration of the ultrasonic actuator 28' is the same as of the ultrasonic actuator 16'. Wiring 8' for supplying electrical power to the ultrasonic actuator 28' enters the side of the X-slider 25'.

Respective flanges 26 extend outward in the Y-direction from the longitudinal "lower" edges of the X-slider 25' Each flange 26 defines a respective screw hole 26a substantially at the center of the flange 26. By these holes the fine-movement table (not shown, but similar to the fine-movement table 34 associated with the fine-movement stage 30 in the first representative embodiment) is secured to the flanges 26.

In this embodiment the fine-movement stage 30 can be moved and positioned in the X-direction or Y-direction without generating any significant magnetic-field fluctuation. This stability is achieved by use of an X-Y coarse-movement stage 2' that employs ultrasonic actuators 28', 16' for achieving "coarse" movements of the fine-movement stage 30. The wafer W, in turn, is positioned accurately by driving the fine-movement stage 30, mounted to the coarse-movement stage 2', in the six available degrees of freedom in the manner described above regarding the first representative embodiment.

Third Representative Embodiment of Stage Device

Figure 6:
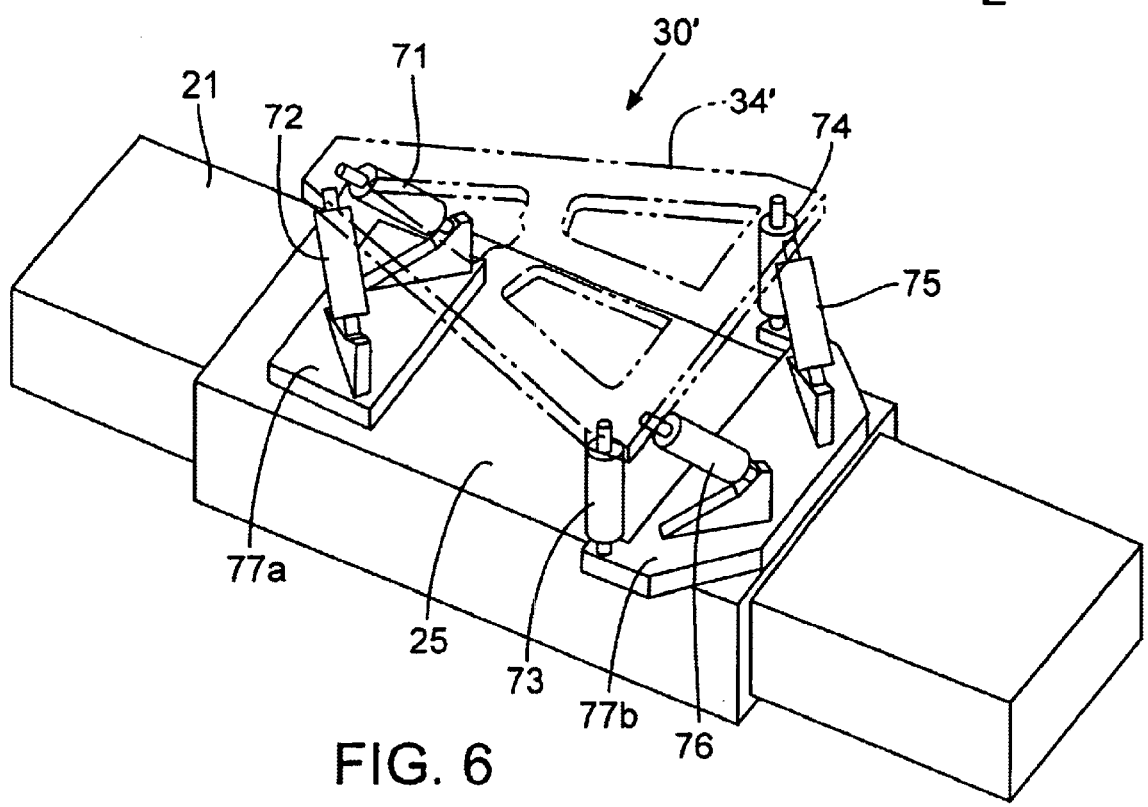
FIG. 6 is an oblique view of the fine-movement table (having six degrees of freedom of motion) as used in the third representative embodiment of a stage device.

Certain components of a stage device according to this embodiment are depicted in FIG. 6. Specifically, FIG. 6 shows a fine-movement stage 30' (having six degrees of freedom of motion) utilizing a parallel-linkage mechanism for driving a fine-movement table 34' (desirably having a triangular profile) relative to an X-slider 25. The X-slider 25 is engaged with a moving guide 21 in the same manner as described in the first representative embodiment. Mounted to the X-slider 25 is the fine-movement stage 30'.

In this embodiment a first actuator-mounting plate 77a and a second actuator-mounting plate 77b are mounted to the "top" surface of the X-slider 25. Two piezo-actuators 71, 72 are rotatably coupled to the first actuator-mounting plate 77a by respective spherical bearings (not shown). Four piezo-actuators 73, 74, 75, 76 are rotatably coupled to the second actuator-mounting plate 77b by respective spherical bearings (not shown). The piezo-actuators 71 and 76 are parallel to each other, the piezo-actuators 72 and 75 are parallel to each other, and the piezo-actuators 73 and 74 are parallel to each other. Hence, each pair of piezo-actuators constitutes a respective parallel-linkage mechanism for the fine-movement table 34' supported thereby. The fine-movement table 34' (shown by "imaginary" lines) is secured to the "upper" ends of the six piezo-actuators 71–76 by respective spherical bearings (not shown). Thus, the fine-movement table 34' is movable with six degrees of freedom (X, Y, Z, $\theta_X$, $\theta_Y$, $\theta_Z$) by selectively extending or shortening the six piezo-actuators 71–76 relative to each other. Although not shown in FIG. 6, multiple capacitance-type position sensors (as described in the first representative embodiment) are placed strategically in the vicinity of the fine-movement table 34' for measuring the position of the fine-movement table 34'.

In this embodiment, the parallel-linkage mechanism of the actuators for moving the fine-movement stage 30' allows the fine-movement table to be driven with great stability at high velocity.

Fourth Representative Embodiment of Stage Device

Figure 7:
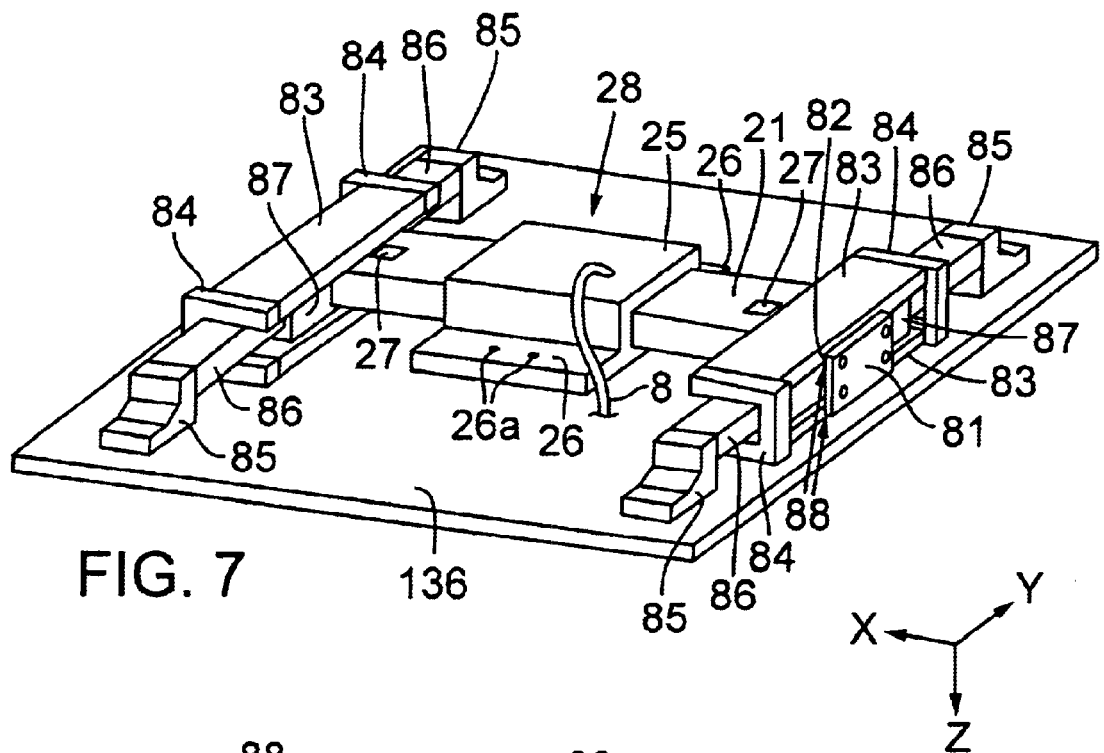
FIG. 7 is an oblique view of the X-Y coarse-movement stage portion of a stage device according to the fourth representative embodiment.
Figure 8:
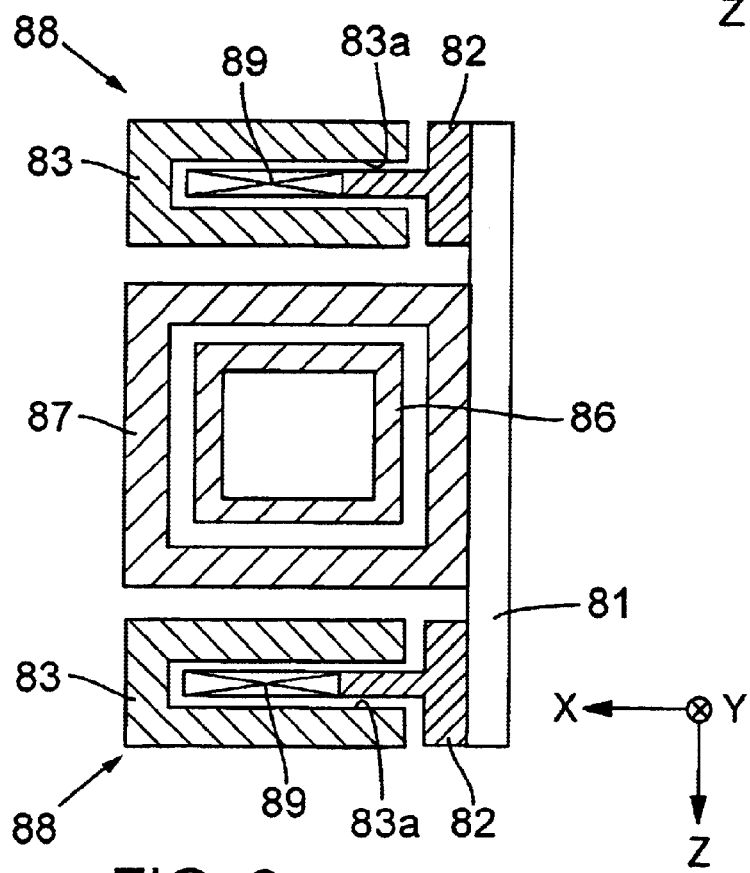
FIG. 8 is a transverse section of a linear motor used in the embodiment shown in FIG. 7.

A stage device according to this embodiment is depicted in FIG. 7, showing an X-Y coarse-movement stage mounted on a base 136. In the coarse-movement stage of this embodiment, two parallel linear motors provide motion in the Y-direction and an air cylinder provides motion in the X-direction. An elevational section of a linear motor as used in this embodiment is shown in FIG. 8. Specifically, the X-Y coarse-movement stage in this embodiment is a so-called H-type stage that performs continuous scanning in the Y-direction by actuation of the two linear motors and performs stepwise motion by actuation of the air cylinder.

Referring further to FIG. 7, two fixed guides 86, each extending parallel to each other in the Y-direction, are secured at respective locations on the upstream-facing surface of the base 136 by respective guide-mounting members 85. Each of these two fixed guides 86 and their peripheral members are configured in basically the same way. A respective hollow-box-shaped Y-slider 87 is engaged with each fixed guide 86 in a manner allowing the Y-sliders 87 to slide along their respective fixed guides in the Y-direction. Such sliding is achieved with substantially zero friction by means of respective air bearings (including air pads 51; see FIG. 2). The air bearings (including guard rings) in this embodiment are situated on the respective "upper" and "lower" surfaces and on both the inwardly and outwardly facing side surfaces of the Y-sliders 87. Respective conduits for supplying air to the air bearings and for exhausting air from the bearings are defined in the fixed guides 86.

Turning to FIG. 8, attached to the outwardly facing side surface of each Y-slider 87 is a respective mounting plate 81 having a defined thickness. Two coil-mounting members 82 are mounted parallel to each other in the Y-direction on the mounting plate 81. Each coil-mounting member 82 has a T-shaped transverse section, of which the stem of the "T" extends in the X-direction. Thus, the T-stems of the coil-mounting members 82 of opposing Y-sliders 87 extend toward each other from the inwardly facing surface of the respective mounting plate 81. Attached to the stem of each coil-mounting member is a respective rectangular plate-shaped actuator coil 89 (see FIG. 8) extending further in the X direction from the respective coil-mounting member 82.

Surrounding each actuator coil 89 on three sides is a respective stator 83, with a gap defined between the stator 83 and the actuator coil 89 on all three sides. Thus, in the section shown in FIG. 8, each stator 83 has a "⊏"-shaped profile (defining a respective groove 83a), and the respective coil-mounting member 82 with actuator coil 89 has a "⊣"-shaped profile, of which the stem is nearly fully inserted into the respective groove 83a. Note that the opening in the groove 83a faces outwardly in the X-direction. Each stator 83 is configured with a series of permanent magnets (e.g., Nd—Fe—B magnets) arranged with SNSNS alternating polarity along the Y-direction length of the stator. Referring further to FIG. 8, the ends (in the Y-direction) of each stator 83 are mounted to respective stator-mounting members 84, which also have a "⊏"-shaped profile in the section shown in the figure. The stator-mounting members 84 collectively secure the stators 83 to the base 136.

With the respective actuator coils 89 inserted into their respective grooves 83a, the actuator coils 89 and respective stators 83 comprise respective linear motors 88 for driving the Y-sliders 87 in the Y-direction along the respective fixed guide 86. With respect to each slider, the driving forces of the respective linear motors 88 above and below the Y-slider 87 are applied collectively at the center-of-gravity of the Y-slider 87. Applying the driving force to the center-of-gravity of each Y-slider 87 in this manner provides highly accurate positional control of the stage device, even when the stage device is driven at high velocity.

Similar to the embodiment shown in FIG. 1, the embodiment of FIG. 7 includes a moving guide 21 that is attached to and that extends in the X-direction between the Y-sliders 87. A hollow-box-shaped X-slider 25 is engaged with the moving guide 21 in a manner allowing the X-slider 25 to slide along the moving guide 21 in the X-direction. Such sliding is achieved with substantially zero friction by means of air bearings (including air pads 51; see FIG. 2). The X-slider 25 in association with its moving guide 21 defines a respective air cylinder 28 (discussed above with reference to FIG. 2), thereby actuating the X-slider 25 to move in the X-direction relative to the moving guide 21.

Respective flanges 26 extend outward in the Y-direction from the longitudinal "lower" edges of the X-slider 25. Each flange 26 defines respective screw holes 26a substantially at the center of the flange 26, by which holes the fine-movement stage 30 is secured to the flanges 26.

Representative Embodiment of Velocity-Control

Figure 9:
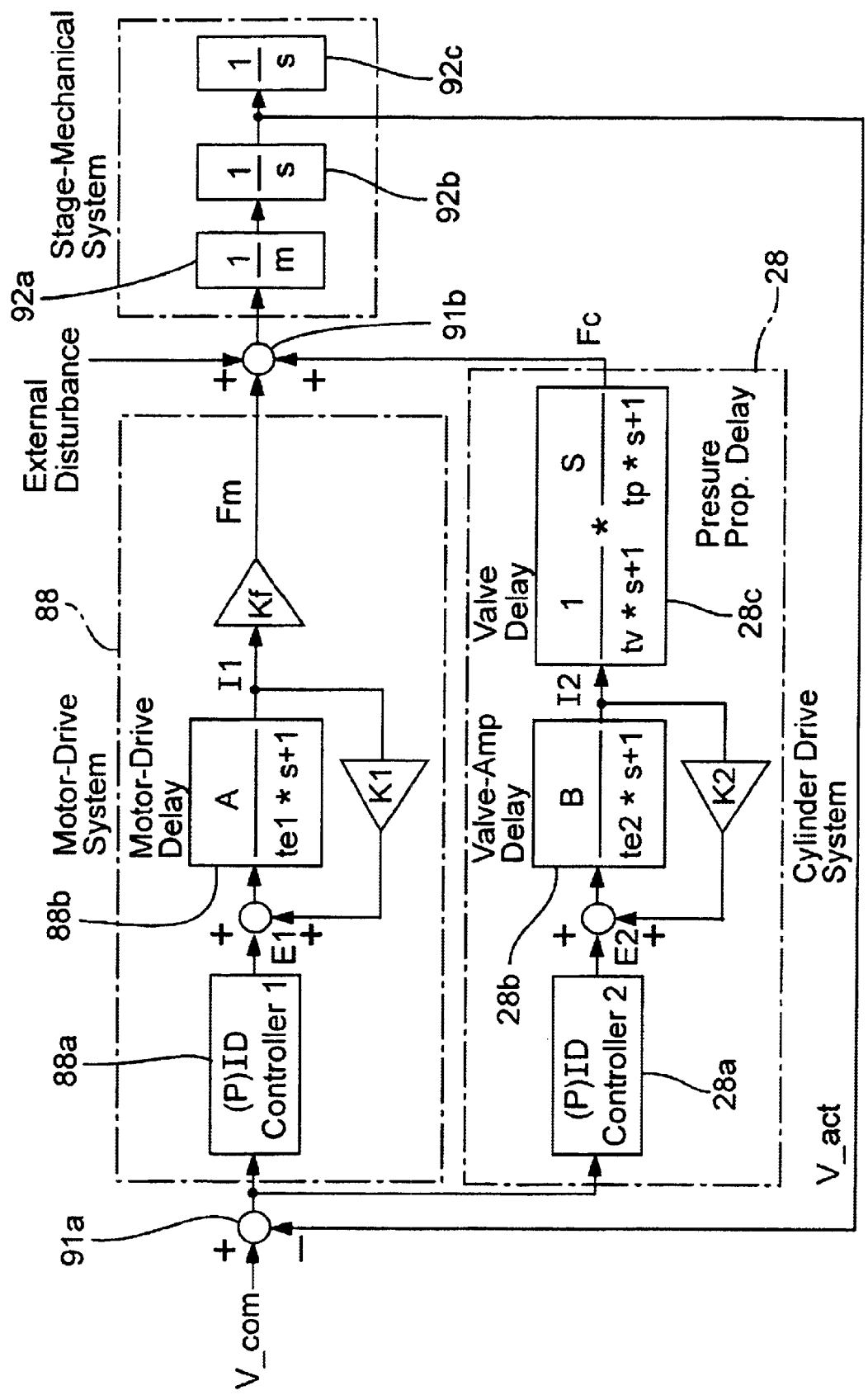
FIG. 9 is a block diagram of an exemplary velocity-control system for any of various embodiments of the stage device.

A block diagram of a representative embodiment of a velocity-control system for a stage device, such as the stage-device embodiment of FIG. 7, is depicted in FIG. 9. The FIG. 9 embodiment is described in the context of being used for controlling the movement velocity of the linear motors 88, the air cylinder 28, and other mechanical systems of the stage device.

Shown in sequence in the drive system of the linear motor 88 are a first "(P)ID" (proportional integral derivative) controller 88a, a first-order delay element 88b of the linear-motor amplifier, and a first proportional element Kf. If the proportional element (P) of the first (P)ID controller 88a is set to be relatively small, and the corresponding integral (I) and derivative (D) elements (having strong compensation) are set to be relatively large, then fine positional control of the linear motor 88 can be achieved. Such control is useful for achieving scan-velocity control and step-positioning control during exposure. In addition, a feedback loop is provided in the first-order delay element 88b by means of the proportional element K1. This feedback loop allows more accurate positional control of the linear motor 88.

Referring further to FIG. 9, a drive-system controller for the air cylinder 28 is shown, comprising (in sequence) a second (P)ID controller 28a, a valve-amplifier-delay element 28b, and an air-valve-delay element 28c. The elements 28b, 28c are first-order delay elements for opening and closing of the air valve and for pressure propagation from the valve to the air cylinder 28. If the proportional element (P) of the second (P)ID controller 28a is set to be relatively large, and the corresponding integral (I) and derivative (D) elements are set to be relatively small, then deviations of the actual velocity (at which the air cylinder is driven) from the target velocity can be eliminated very quickly. Such control is useful during stage acceleration. In addition, a feedback loop is provided in the first-order lag element 28b by means of the proportional element K2. This feedback loop allows more accurate positional control of the air cylinder 28.

Also shown in FIG. 9 is the mechanical system of the stage device. The mechanical system comprises, in sequence, an inertial subsystem 92a, an acceleration-integration subsystem 92b, and a velocity-integration subsystem 92c.

In FIG. 9, a target velocity V_com, output from the computer controlling the microlithography system, enters at the left of the block diagram. The target-velocity V_com input to the block diagram passes a junction 91a and is transmitted to both the motor-drive system (for the linear motor 88) and the air-cylinder-drive system (for the air cylinder 28). In response to V_com, respective control data Fm, Fc are output from the motor-drive system and the air-cylinder-drive system, respectively. The control data Fm, Fc are added together at junction 91b and input to the mechanical system of the stage device. Note that external disturbances (e.g., electrical resistance in wiring, vibration, and stage-reaction forces) also are added at the junction 91b. The velocity value V_act output from the acceleration-integration subsystem 92b of the stage mechanical system is fed back to the junction 91a.

As described above, in this embodiment, it is possible to achieve a hybrid control that performs stage positioning that is faster and more accurate than conventionally. This is achieved by independently controlling the respective drive systems of the linear motor 88 and of the air cylinder 28, and incorporating feedback control as shown and described above.

Fifth Representative Embodiment of Stage Device

Figure 10:
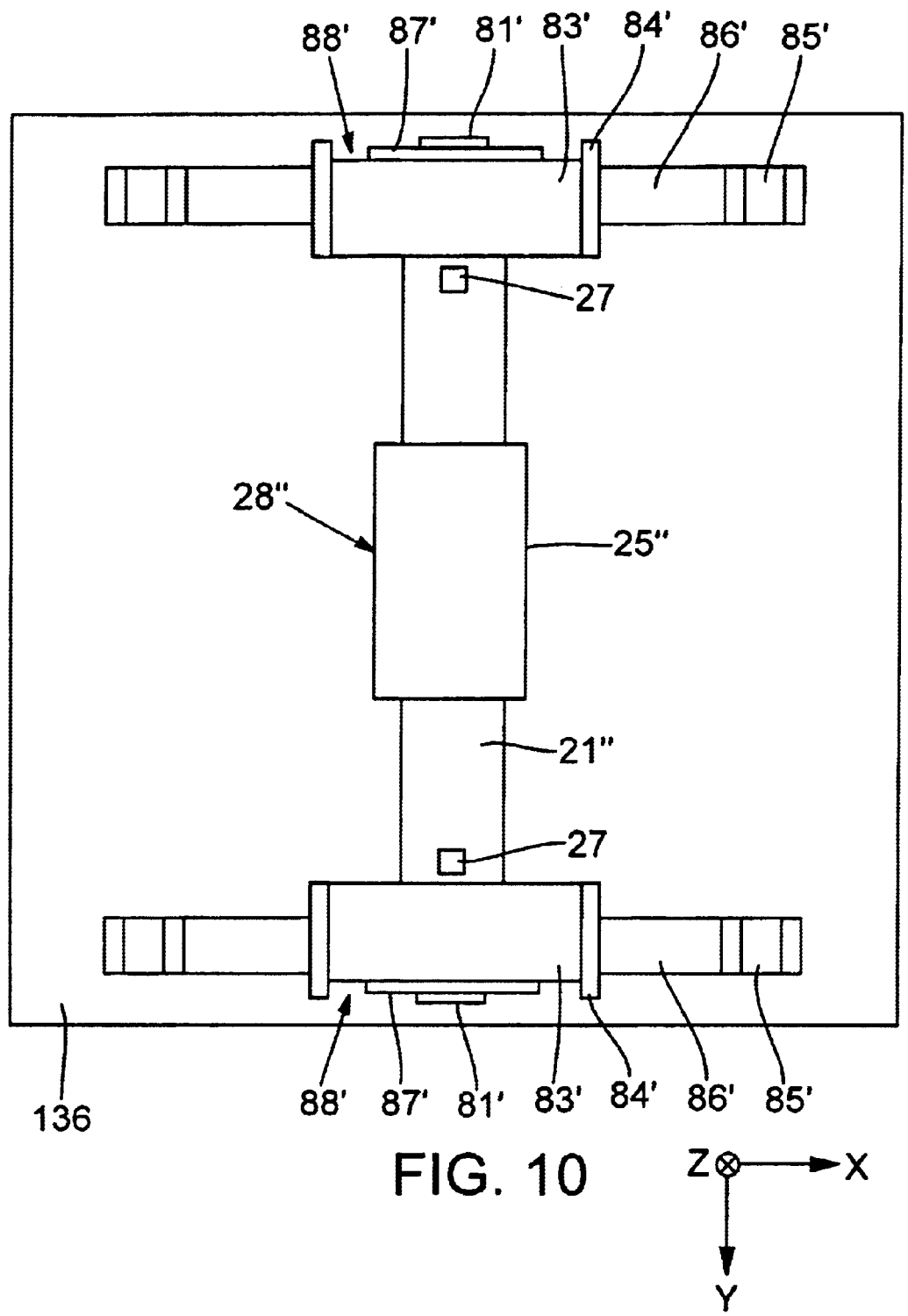
FIG. 10 is a plan view of the X-Y coarse-movement stage portion of a stage device according to the fifth representative embodiment.

A stage device 1 according to a fifth representative embodiment is depicted in FIG. 10, showing an X-Y coarse-movement stage mounted on the base 136. In this embodiment the X-Y coarse-movement stage comprises an air cylinder used as an actuator for achieving Y-direction motion and linear motors used as actuators for achieving X-direction motion. Specifically, this X-Y coarse-movement stage is a so-called "I-type" stage that performs controlled stepping motion of the stage using the two linear motors arranged in parallel and performs controlled scanning motions of the stage using an air cylinder.

It will be noted that most of the X-Y coarse-movement stage of this embodiment is configured similarly to the coarse-movement stage shown in FIG. 7. However, in FIG. 10 the maximum available distance of motion in the scan axis (Y-axis) is longer, and the maximum available distance of motion in the step axis (X-axis) also is longer.

Two fixed guides 86', extending parallel to each other in the X-direction, are secured at respective locations on the upstream-facing surface of the base 136 (see FIG. 4) by respective guide-mounting members 85'. Characteristic of an I-type stage, the two fixed guides 86' are shorter than the corresponding fixed guides 86 in the embodiment of FIG. 7. A respective hollow-box-shaped X-slider 87' is engaged with each fixed guide 86' in a manner allowing the X-sliders 87' to slide along their respective fixed guides 86' in the X-direction. Such sliding is achieved with substantially zero friction by means of respective air bearings (including air pads 51; see FIG. 2). Each X-slider 87' in association with its respective fixed guide 86' defines a respective linear motor 88' (see FIG. 8) by which the X-sliders 87' are driven together in the X-direction (i.e., along the scan axis).

A moving guide 21" is attached to and extends in the Y-direction between the X-sliders 87'. A hollow-box-shaped Y-slider 25" is engaged with the moving guide 21" in a manner allowing the Y-slider 25" to slide along the moving guide 21" in the Y-direction. Such sliding is achieved with substantially zero friction by means of air bearings (including air pads 51; see FIG. 2). The Y-slider 25" in association with its moving guide 21 "define a respective air cylinder 28" (discussed above with respect to FIG. 2), thereby actuating the Y-slider 25" to move in the Y-direction (step axis) relative to the moving guide 21".

Any of the stage devices described above can be mounted to a reticle stage 111 (see FIG. 4). In such a configuration, two moving guides 21 (FIG. 1) can be arranged in parallel, wherein the lithography beam passes between the moving guides. A cantilevered table can be extended toward the moving guides 21 for loading and unloading the reticle from the reticle stage.

Microelectronic-Device Fabrication Process

Figure 11:
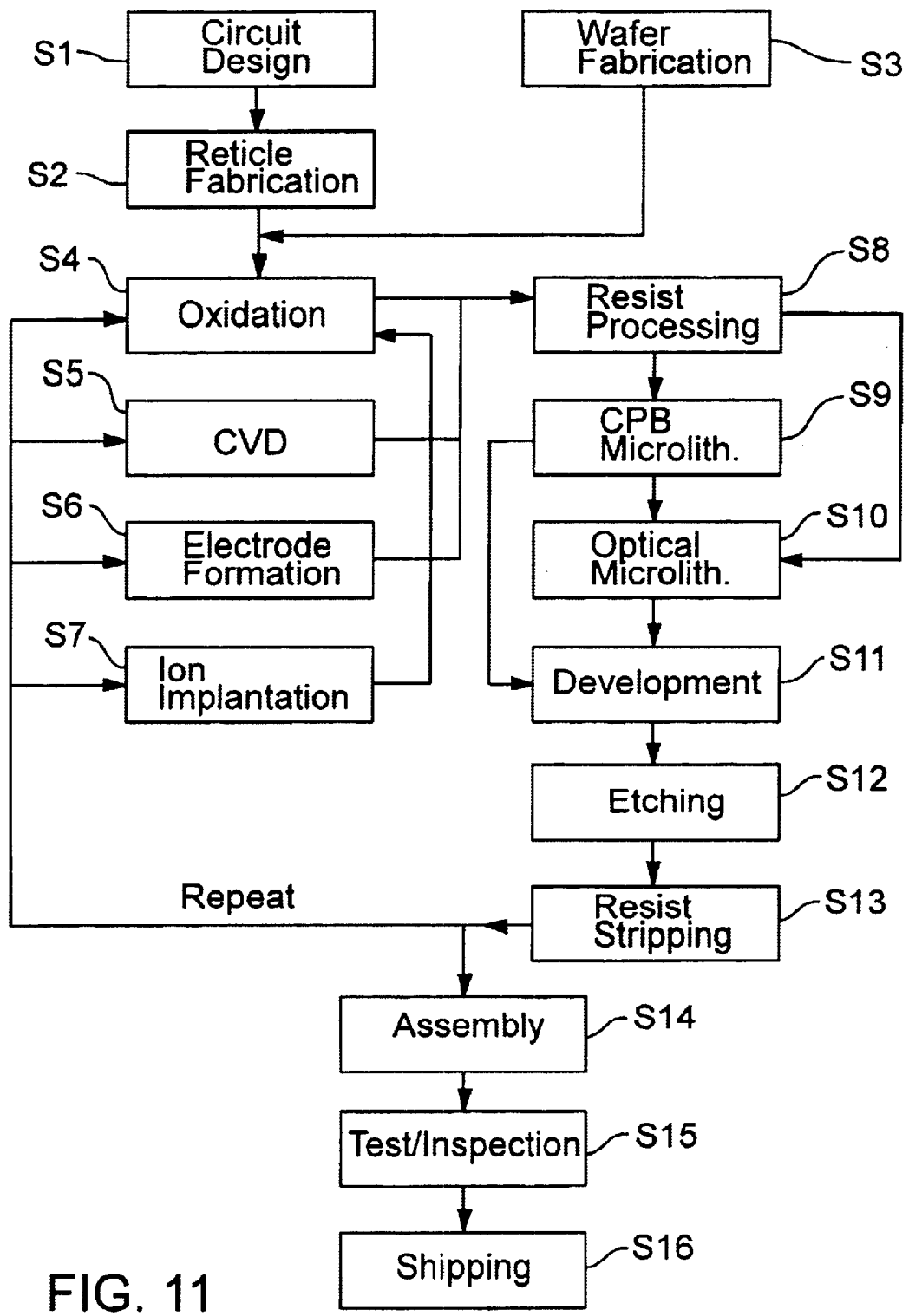
FIG. 11 is a flowchart of steps in a process for manufacturing a microelectronic device such as a semiconductor chip (e.g., integrated circuit or LSI), liquid-crystal panel, CCD, thin-film magnetic head, or micromachine, the process including performing microlithography using a microlithography apparatus as described herein.

FIG. 11 is a flow chart of steps in an exemplary process for manufacturing a microelectronic device such as a semiconductor chip (e.g., an integrated circuit or LSI device), a display panel (e.g., liquid-crystal panel), charged-coupled device (CCD), thin-film magnetic head, micromachine, for example. In step S1, the circuit for the device is designed. In step S2 a reticle ("mask") for the circuit is manufactured. In step S2, local resizing of pattern elements can be performed to correct for proximity effects or space-charge effects during exposure. In step S3, a wafer (substrate) is manufactured from a material such as silicon.

Steps S4–S13 are directed to wafer-processing steps (described below), in which the circuit pattern defined on the reticle is transferred onto the wafer by microlithography. Steps S14–S16 are "post-process" steps. Specifically, step S14 is an assembly step in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability, qualification, and durability tests of the device produced in step S14 are conducted. Afterward, devices that successfully pass step S15 are finished, packaged, and shipped (step S16).

Steps S4–S13 provide representative details of wafer processing. Step S4 is an oxidation step for oxidizing the surface of a wafer. Step S5 involves chemical vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves microlithographically exposing the resist using a charged particle beam so as to imprint the resist with the reticle pattern of the reticle produced in step S2. In step S9, a CPB microlithography apparatus as described above can be used. Step S10 involves microlithographically exposing the resist using optical microlithography. This step also can be performed using a reticle as produced in step S2. Also, during Step S110, an exposure can be performed (before, during, or after the pattern exposure) in a manner serving to correct proximity effects (e.g., normalizing backscattered electrons of the patterned beam). Step S11 involves developing the exposed resist on the wafer. Step S12 involves etching the wafer to remove material from areas where developed resist is absent. Step S13 involves resist separation (resist "stripping"), in which remaining resist on the wafer is removed after the etching step. By repeating steps S4–S13 as required, circuit patterns as defined by successive reticles are formed superposedly on the wafer.

Whereas the invention has been described in the context of multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A stage device for holding and moving an object in a space defined by an X-direction, a Y-direction, and a Z-direction that are mutually perpendicular to each other, the stage device comprising:
    an X-Y coarse-movement stage portion comprising a moving member and respective coarse-movement actuators situated and configured to move the moving member in an X-Y plane defined by the X-direction and the Y-direction; and
    a fine-movement stage portion, including a fine-movement table and a fine-movement actuator system coupled to the fine-movement table, the fine-movement table being mounted on the moving member of the X-Y coarse-movement stage portion, the fine-movement actuator system being configured to move the fine-movement table relative to the X-Y coarse-movement stage portion in any of six degrees of freedom of motion including motion in the X-direction, the Y-direction, the Z-direction, an angle $\theta_X$ about an X-direction axis, an angle $\theta_Y$ about a Y-direction axis, and an angle $\theta_Z$ about a Z-direction axis, wherein at least one of the coarse-movement actuators is configured to produce a respective motion of the moving member without generating any significant magnetic fields or magnetic-field fluctuations.

2. The stage device of claim 1, wherein the coarse-movement actuators collectively consist of respective non-electromagnetic actuators or a combination of respective non-electromagnetic actuators and respective electromagnetic actuators.

3. The stage device of claim 1, wherein the fine-movement actuator system comprises multiple piezo-electric actuators.

4. The stage device of claim 1, wherein the fine-movement table is supported relative to the moving member of the X-Y coarse-movement stage portion by the fine-movement actuator system.

5. The stage device of claim 4, wherein the fine-movement actuator system comprises multiple piezo-electric actuators.

6. The stage device of claim 5, wherein the fine-movement table has three corners each supported by a respective pair of piezo-electric actuators extending from the respective corner to the moving member of the X-Y coarse-movement stage portion.

7. The stage device of claim 6, wherein one of the respective piezo-electric actuators on each corner is parallel to one of the respective piezo-electric actuators on another of the corners.

8. The stage device of claim 1, wherein the fine-movement table is supported relative to the moving member of the X-Y coarse-movement stage portion by the fine-movement actuator system that comprises a parallel-linkage mechanism.

9. The stage device of claim 8, wherein:
    the parallel-linkage mechanism comprises at least three pairs of fine-movement actuators extending from respective locations on the fine-movement table to the moving member of the X-Y coarse-movement stage portion; and
    one of the respective fine-movement actuators at each location is parallel to one of the respective fine-movement actuators at another of the locations.

10. The stage device of claim 9, wherein the fine-movement actuators are piezo-electric actuators.

11. The stage device of claim 1, wherein:
    the fine-movement table has first, second, and third corners;
    the fine-movement table is supported at each corner relative to the moving member of the X-Y coarse-movement stage portion;
    extending from each corner on the fine-movement table to the moving member of the coarse-movement stage portion are two respective fine-movement piezo-actuators of the fine-movement actuator system; and
    one of the respective fine-movement piezo-electric actuators at each corner is parallel to one of the respective fine-movement piezo-electric actuators at another of the corners.

12. The stage device of claim 1, wherein the X-Y coarse-movement stage portion comprises:
    two fixed guides extending parallel to each other in a first direction within the X-Y plane, each fixed guide having a respective first slider that is slidable relative to the fixed guide as guided by the respective fixed guide;
    a respective coarse-movement drive mechanism associated with each of the first sliders and configured to cause motion of the respective first slider relative to the respective fixed guide;
    a moving guide attached to both first sliders and extending in a second direction from one first slider to the other;
    a second slider that is slidable relative to the moving guide as guided by the moving guide; and
    a coarse-movement drive mechanism associated with the second slider and configured to cause motion of the second slider relative to the moving guide;
    wherein the coarse-movement drive mechanisms associated with the first sliders are respective linear motors, and the coarse-movement drive mechanism associated with the second slider is a non-electromagnetic actuator.

13. The stage apparatus of claim 12, wherein:
    the X-Y coarse-movement stage portion is an H-type stage configuration;
    the first sliders slide along their respective fixed guides in a direction parallel to a scan axis of the stage apparatus; and
    the second slider slides along its moving guide in a direction parallel to a step axis of the stage apparatus.

14. The stage device of claim 12, wherein:
    the X-Y coarse-movement stage portion is an I-type stage configuration;
    the first sliders slide along their respective fixed guides in a direction parallel to a step axis of the stage apparatus; and
    the second slider slides along its moving guide in a direction parallel to a scan axis of the stage apparatus.

15. The stage device of claim 1, configured as a reticle stage or substrate stage for use in a microlithography apparatus.

16. The stage device of claim 12, configured as a reticle stage or substrate stage for use in a microlithography apparatus.

17. The stage device of claim 2, wherein the coarse-movement actuators collectively comprise (i) at least one air cylinder and at least one ultrasonic actuator, (ii) at least one air cylinder and at least one linear motor, or (iii) at least one ultrasonic actuator and at least one linear motor.

18. The stage device of claim 1, wherein the at least one of the coarse-movement actuators is a respective non-electromagnetic actuator.

19. The stage device of claim 18, wherein each of the coarse-movement actuators is a respective air cylinder or a respective ultrasonic actuator, or the coarse-movement actuators collectively include at least one respective air cylinder and at least one respective ultrasonic actuator.

20. The stage device of claim 1, wherein at least one coarse-movement actuator comprises a respective air cylinder comprising a respective slider and a respective guide relative to which the slider is movable.

21. The stage device of claim 20, wherein the slider comprises at least one bearing situated relative to the slider and the guide so as to allow the slider to move with substantially zero friction relative to the guide.

22. The stage device of claim 21, wherein the bearing is an air bearing.

23. The stage device of claim 20, wherein the air cylinder further comprises at least one respective air-control valve coupled to the air cylinder and configured to control air pressure within an air chamber of the air cylinder.

24. The stage device of claim 23, wherein the air-control valve is a servo valve driven by a voice-coil motor.

25. The stage device of claim 1, wherein:
at least one coarse-movement actuator comprises a first portion that is movable relative to a second portion; and
between the first portion and the second portion is a bearing by which the first portion moves with substantially zero friction relative to the second portion.

26. The stage device of claim 25, wherein the bearing is an air bearing.

27. The stage device of claim 1, wherein the fine-movement actuator system further comprises at least one position-sensor situated and configured to sense a position of the fine-movement stage portion.

28. The stage device of claim 27, wherein the fine-movement actuator system further comprises multiple position-sensors situated and configured to measure the position of the fine-movement table in respective directions and angles in the six degrees of freedom.

29. The stage device of claim 1, wherein at least one of the coarse-movement actuators is a controlled actuator that comprises a velocity-control system configured to control the velocity at which the controlled actuator moves the moving member.

30. The stage device of claim 29, wherein the velocity-control system comprises at least one proportional integral derivative controller.

31. The stage device of claim 30, wherein:
the controlled actuator is a linear motor;
the velocity-control system further comprises, in association with the proportional integral derivative controller, a respective first-order delay element of an amplifier associated with the linear motor and a first proportional element; and
the velocity-control system is configured to achieve velocity-controlled actuation of the linear motor by feedback control.

32. The stage device of claim 30, wherein:
the controlled actuator is an air cylinder comprising an air valve;
the velocity-control system further comprises, in association with the proportional integral derivative controller, a respective valve-amplifier-delay element and a respective air-valve-delay element associated with an amplifier connected to the air valve; and
the velocity-control system is configured to achieve velocity-controlled actuation of the air cylinder by feedback control.

33. The stage device of claim 29, wherein:
the controlled actuators comprise first and second controlled actuators; and
each of the first and second controlled actuators includes a velocity-control system configured to provide independent, feedback-controlled actuation of the respective controlled actuator.

34. A stage device for holding and moving an object in a space defined by an X-direction, a Y-direction, and a Z-direction that are mutually perpendicular to each other, the stage device comprising:
an X-Y coarse-movement stage portion comprising a moving member and respective coarse-movement actuators situated and configured to move the moving member in an X-Y plane defined by the X-direction and the Y-direction; and
a fine-movement stage portion, including a fine-movement table and a fine-movement actuator system coupled to the fine-movement table, the fine-movement table being mounted on the moving member of the X-Y coarse-movement stage portion, the fine-movement actuator system being configured to move the fine-movement table relative to the X-Y coarse-movement stage portion in any of six degrees of freedom of motion including motion in the X-direction, the Y-direction, the Z-direction, an angle $\theta_x$ about an X-direction axis, an angle $\theta_y$ about a Y-direction axis, and an angle $\theta_z$ about a Z-direction axis, wherein the fine-movement actuator system comprises multiple piezo-electric actuators.

35. The stage device of claim 34, wherein the fine-movement table is supported relative to the moving member of the X-Y coarse-movement stage portion by the fine-movement actuator system.

36. A stage device for holding and moving an object in a space defined by an X-direction, a Y-direction, and a Z-direction that are mutually perpendicular to each other, the stage device comprising:
an X-Y coarse-movement stage portion comprising a moving member and respective coarse-movement actuators situated and configured to move the moving member in an X-Y plane defined by the X-direction and the Y-direction; and
a fine-movement stage portion, including a fine-movement table and a fine-movement actuator system coupled to the fine-movement table, the fine-movement table being mounted on the moving member of the X-Y coarse-movement stage portion, the fine-movement actuator system being configured to move the fine-movement table relative to the X-Y coarse-movement stage portion in any of six degrees of freedom of motion including motion in the X-direction, the Y-direction, the Z-direction, an angle $\theta_x$ about an X-direction axis, an angle $\theta_y$ about a Y-direction axis, and an angle $\theta_z$ about a Z-direction axis, wherein the fine-movement table is supported relative to the moving member of the X-Y coarse-movement stage portion by the fine-movement actuator system, and the fine-movement actuator system comprises multiple piezo-electric actuators.

37. The stage device of claim 36, wherein the fine-movement table has three corners each supported by a respective pair of piezo-electric actuators extending from the respective corner to the moving member of the X-Y coarse-movement stage portion.

38. The stage device of claim 37, wherein one of the respective piezo-electric actuators on each corner is parallel to one of the respective piezo-electric actuators on another of the corners.

39. A stage device for holding and moving an object in a space defined by an X-direction, a Y-direction, and a Z-direction that are mutually perpendicular to each other, the stage device comprising:
   an X-Y coarse-movement stage portion comprising a moving member and respective coarse-movement actuators situated and configured to move the moving member in an X-Y plane defined by the X-direction and the Y-direction; and
   a fine-movement stage portion, including a fine-movement table and a fine-movement actuator system coupled to the fine-movement table, the fine-movement table being mounted on the moving member of the X-Y coarse-movement stage portion, the fine-movement actuator system being configured to move the fine-movement table relative to the X-Y coarse-movement stage portion in any of six degrees of freedom of motion including motion in the X-direction, the Y-direction, the Z-direction, an angle $\theta_x$ about an X-direction axis, an angle $\theta_y$ about a Y-direction axis, and an angle $\theta_z$ about a Z-direction axis, wherein the fine-movement table is supported relative to the moving member of the X-Y coarse-movement stage portion by the fine-movement actuator system that comprises a parallel-linkage mechanism.

40. The stage device of claim 39, wherein:
   the parallel-linkage mechanism comprises at least three pairs of fine-movement actuators extending from respective locations on the fine-movement table to the moving member of the X-Y coarse-movement stage portion; and
   one of the respective fine-movement actuators at each location is parallel to one of the respective fine-movement actuators at another of the locations.

41. The stage device of claim 40, wherein the fine-movement actuators are piezo-electric actuators.

42. A stage device for holding and moving an object in a space defined by an X-direction, a Y-direction, and a Z-direction that are mutually perpendicular to each other, the stage device comprising:
   an X-Y coarse-movement stage portion comprising a moving member and respective coarse-movement actuators situated and configured to move the moving member in an X-Y plane defined by the X-direction and the Y-direction; and
   a fine-movement stage portion, including a fine-movement table and a fine-movement actuator system coupled to the fine-movement table, the fine-movement table being mounted on the moving member of the X-Y coarse-movement stage portion, the fine-movement actuator system being configured to move the fine-movement table relative to the X-Y coarse-movement stage portion in any of six degrees of freedom of motion including motion in the X-direction, the Y-direction, the Z-direction, an angle $\theta_x$ about an X-direction axis, an angle $\theta_y$ about a Y-direction axis, and an angle $\theta_z$ about a Z-direction axis,
   wherein the fine-movement table has first, second, and third corners;
   the fine-movement table is supported at each corner relative to the moving member of the X-Y coarse-movement stage portion;
   extending from each corner on the fine-movement table to the moving member of the coarse-movement stage portion are two respective fine-movement piezo-actuators of the fine-movement actuator system; and
   one of the respective fine-movement piezo-electric actuators at each corner is parallel to one of the respective fine-movement piezo-electric actuators at another of the corners.

43. A stage device for holding and moving an object in a space defined by an X-direction, a Y-direction, and a Z-direction that are mutually perpendicular to each other, the stage device comprising:
   an X-Y coarse-movement stage portion comprising a moving member and respective coarse-movement actuators situated and configured to move the moving member in an X-Y plane defined by the X-direction and the Y-direction; and
   a fine-movement stage portion, including a fine-movement table and a fine-movement actuator system coupled to the fine-movement table, the fine-movement table being mounted on the moving member of the X-Y coarse-movement stage portion, the fine-movement actuator system being configured to move the fine-movement table relative to the X-Y coarse-movement stage portion in any of six degrees of freedom of motion including motion in the X-direction, the Y-direction, the Z-direction, an angle $\theta_x$ about an X-direction axis, an angle $\theta_y$ about a direction axis, and an angle $\theta_z$ about a Z-direction axis, wherein the X-Y coarse-movement stage portion comprises (i) two fixed guides extending parallel to each other in a first direction within the X-Y plane, each fixed guide having a respective first slider that is slidable relative to the fixed guide as guided by the respective fixed guide; (ii) a respective coarse-movement drive mechanism associated with each of the first sliders and configured to cause motion of the respective first slider relative to the respective fixed guide; (iii) a moving guide attached to both first sliders and extending in a second direction from one first slider to the other; (iv) a second slider that is slidable relative to the moving guide as guided by the moving guide; and (v) a coarse-movement drive mechanism associated with the second slider and configured to cause motion of the second slider relative to the moving guide;
   wherein the coarse-movement drive mechanisms associated with the first sliders are respective linear motors, and the coarse-movement drive mechanism associated with the second slider is a non-electromagnetic actuator.

44. The stage apparatus of claim 43, wherein:

the X-Y coarse-movement stage portion is an H-type stage configuration;

the first sliders slide along their respective fixed guides in a direction parallel to a scan axis of the stage apparatus; and the second slider slides along its moving guide in a direction parallel to a step axis of the stage apparatus.

45. The stage device of claim 43, wherein:

the X-Y coarse-movement stage portion is an I-type stage configuration;

the first sliders slide along their respective fixed guides in a direction parallel to a step axis of the stage apparatus; and the second slider slides along its moving guide in a direction parallel to a scan axis of the stage apparatus.

46. The stage device of claim 43, configured as a reticle stage or substrate stage for use in a microlithography apparatus.

* * * * *

UNITED STATES PATENT AND TRADEMARK OFFICE
CERTIFICATE OF CORRECTION

PATENT NO. : 6,867,534 B2
DATED : March 15, 2005
INVENTOR(S) : Keiichi Tanaka

It is certified that error appears in the above-identified patent and that said Letters Patent is hereby corrected as shown below:

Column 1,
Lines 11-12, "'sensitive' substrate" should be -- "sensitive" substrate) --.
Line 30, "to respective slider" should be -- to a respective slider --.

Column 2,
Line 37, "applied If" should be -- applied. If --.

Column 7,
Line 45, "and $\theta_z$ motions." should be -- and $\theta_z$ motions). --.

Column 9,
Line 8, "60 Also" should be -- 60. Also --.

Column 12,
Line 31, "25' Each" should be -- 25'. Each --.

Column 16,
Line 12, "21 'define" should be -- 21" define --.
Line 64, "Step S110" should be -- Step S10 --.

Signed and Sealed this

Twentieth Day of December, 2005

JON W. DUDAS
*Director of the United States Patent and Trademark Office*